US009719420B2

(12) United States Patent
DiMascio et al.

(10) Patent No.: US 9,719,420 B2
(45) Date of Patent: Aug. 1, 2017

(54) GAS TURBINE COMPONENT AND PROCESS FOR PRODUCING GAS TURBINE COMPONENT

(71) Applicant: GENERAL ELECTRIC COMPANY, Schenectady, NY (US)

(72) Inventors: Paul Stephen DiMascio, Greer, SC (US); Victor John Morgan, Simpsonville, SC (US); Jason Robert Parolini, Greer, SC (US); Glenn Curtis Taxacher, Simpsonville, SC (US); Frederic Woodrow Roberts, Jr., Simpsonville, SC (US); Jacob John Kittleson, Greenville, SC (US); John McConnell Delvaux, Fountain Inn, SC (US)

(73) Assignee: General Electric Company, Schenectady, NY (US)

( * ) Notice: Subject to any disclaimer, the term of this patent is extended or adjusted under 35 U.S.C. 154(b) by 44 days.

(21) Appl. No.: 14/292,969

(22) Filed: Jun. 2, 2014

(65) Prior Publication Data
US 2015/0345388 A1    Dec. 3, 2015

(51) Int. Cl.
*F02C 7/00* (2006.01)
*B23K 1/00* (2006.01)
(Continued)

(52) U.S. Cl.
CPC .............. *F02C 7/00* (2013.01); *B23K 1/0018* (2013.01); *B23P 6/002* (2013.01); *B23P 6/007* (2013.01);
(Continued)

(58) Field of Classification Search
CPC .......... F02C 7/00; F05D 2230/90; F23R 3/60; B23P 6/002
See application file for complete search history.

(56) References Cited

U.S. PATENT DOCUMENTS

| | | | |
|---|---|---|---|
| 5,601,674 A | * | 2/1997 | Szweda ................... B32B 18/00 156/89.11 |
| 5,928,448 A | | 7/1999 | Daws |

(Continued)

OTHER PUBLICATIONS

Roughness Chart <http://blog.kasthurimmc.com/wp-content/uploads/2010/09/Roughness-value-chart.jpg> Dated Sep. 2010. Ret. Mar. 2016.*

*Primary Examiner* — Jacob Cigna
(74) *Attorney, Agent, or Firm* — McNees Wallace & Nurick LLC

(57) ABSTRACT

A process of producing a ceramic matrix composite gas turbine component and a ceramic matrix composite gas turbine component are provided. The process includes modifying a surface of the ceramic matrix composite gas turbine component to produce a modified surface with a surface roughness of less than 6 micrometers. The modifying is selected from the group of techniques consisting of applying unreinforced matrix plies to the surface, vapor depositing silicon on the surface, honing the surface, applying braze paste to the surface, and combinations thereof. The component includes a modified surface including a surface roughness of less than 6 micrometers. The modified surface being selected from the group consisting of unreinforced matrix plies applied to a surface of the ceramic matrix composite gas turbine component, silicon vapor deposited on the surface, a honed surface, a braze paste applied to the surface, and combinations thereof.

42 Claims, 2 Drawing Sheets

(51) Int. Cl.
*B23P 6/00* (2006.01)
*B24B 33/00* (2006.01)
*C04B 41/00* (2006.01)
*C04B 41/45* (2006.01)
*C04B 41/50* (2006.01)
*C04B 41/53* (2006.01)
*C04B 41/85* (2006.01)
*C04B 41/91* (2006.01)
*C04B 41/87* (2006.01)
*C04B 41/88* (2006.01)
*C04B 41/51* (2006.01)
*C23C 16/24* (2006.01)

(52) U.S. Cl.
CPC ............ *B24B 33/00* (2013.01); *C04B 41/009* (2013.01); *C04B 41/4531* (2013.01); *C04B 41/5025* (2013.01); *C04B 41/5096* (2013.01); *C04B 41/5144* (2013.01); *C04B 41/53* (2013.01); *C04B 41/85* (2013.01); *C04B 41/87* (2013.01); *C04B 41/88* (2013.01); *C04B 41/91* (2013.01); *C23C 16/24* (2013.01); *F05D 2230/30* (2013.01); *F05D 2230/90* (2013.01); *F05D 2300/6033* (2013.01); *Y10T 156/10* (2015.01); *Y10T 428/24355* (2015.01)

(56) References Cited

U.S. PATENT DOCUMENTS

| | | | |
|---|---|---|---|
| 6,397,603 B1* | 6/2002 | Edmondson | F23R 3/60 60/746 |
| 6,820,334 B2 | 11/2004 | Kebbede et al. | |
| 2004/0123599 A1* | 7/2004 | Ackermann | F01D 5/288 60/770 |
| 2006/0141154 A1* | 6/2006 | Thebault | C04B 41/52 427/249.2 |
| 2008/0089781 A1* | 4/2008 | Johnson | F01D 11/008 415/119 |
| 2008/0112804 A1* | 5/2008 | Bhate | F01D 5/284 415/209.3 |
| 2011/0027559 A1* | 2/2011 | Kirby | C04B 35/16 428/215 |
| 2011/0219775 A1* | 9/2011 | Jarmon | C04B 35/573 60/753 |
| 2013/0224471 A1* | 8/2013 | Sheedy | C04B 41/81 428/312.6 |
| 2014/0004293 A1* | 1/2014 | Grooms, II | F04D 29/60 428/99 |
| 2014/0255170 A1* | 9/2014 | Hillier | F01D 5/284 415/174.2 |
| 2014/0272248 A1* | 9/2014 | Chamberlain | F01D 5/005 428/63 |
| 2014/0272431 A1* | 9/2014 | Chamberlain | B32B 38/0008 428/446 |
| 2015/0197456 A1* | 7/2015 | Oboodi | C04B 41/52 428/142 |

* cited by examiner

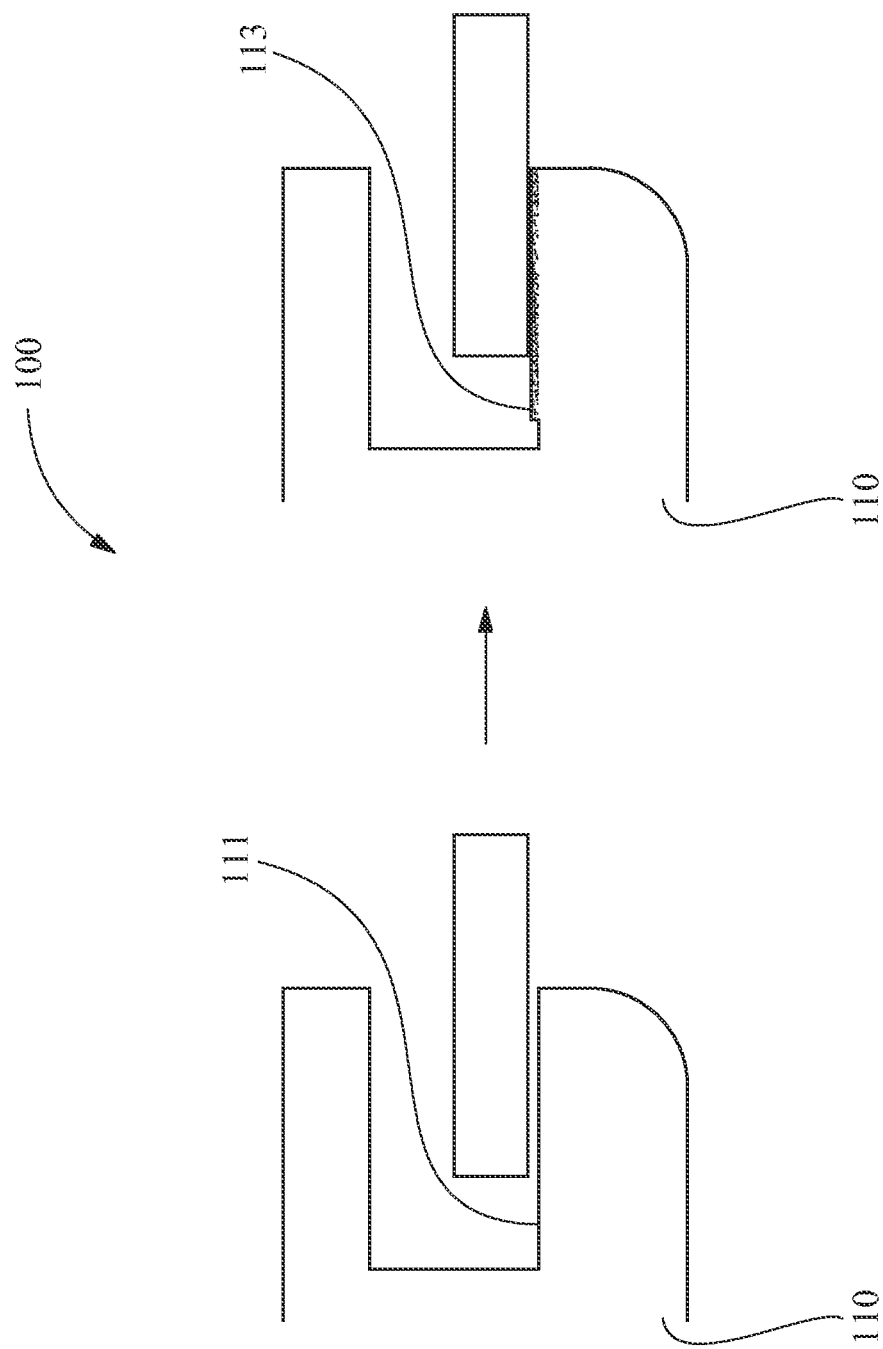

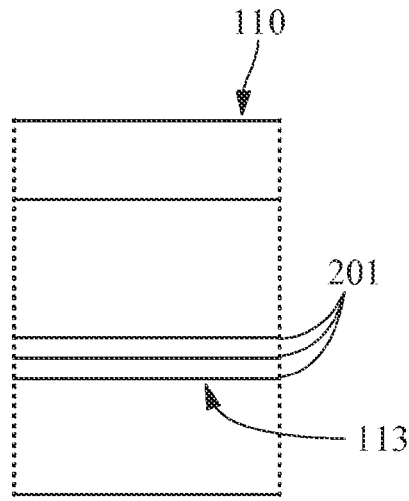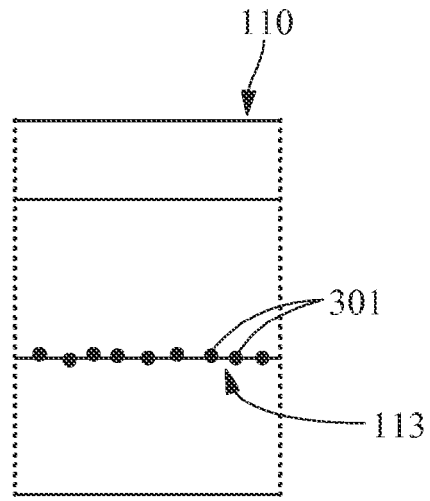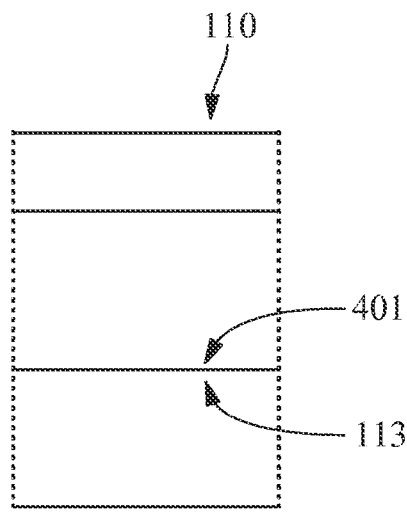

GAS TURBINE COMPONENT AND PROCESS FOR PRODUCING GAS TURBINE COMPONENT

FIELD OF THE INVENTION

The present invention is directed to a gas turbine component and a process for producing a gas turbine component. More specifically, the present invention is directed to a ceramic matrix composite gas turbine component and a process of producing a ceramic matrix composite gas turbine component.

BACKGROUND OF THE INVENTION

Certain ceramic matrix composite (CMC) materials include a composition having a ceramic matrix reinforced with coated fibers. The composition provides strong, lightweight, and heat resistant properties with possible applications in a variety of different systems. However, exposed fibers, for example, in a seal slot region of a turbine component, are difficult to machine, thereby making it difficult to achieve high surface finish required for sealing.

When the turbine component is within a hot gas path of a gas turbine, the seal slot region may be exposed to high operating temperatures. Exposed fiber in this area under high temperature is undesirable and can result in reduced component life.

A process and an article that show one or more improvements in comparison to the prior art would be desirable in the art.

BRIEF DESCRIPTION OF THE INVENTION

In an embodiment, a process of producing a ceramic matrix composite gas turbine component includes modifying a surface of the ceramic matrix composite gas turbine component to produce a modified surface with a surface roughness of less than 6 micrometers. The modifying is selected from the group of techniques consisting of applying unreinforced matrix plies to the surface, vapor depositing silicon on the surface, honing the surface, applying braze paste to the surface, and combinations thereof.

In another embodiment, a process of producing a ceramic matrix composite gas turbine component includes modifying a surface positioned in a seal slot along a hot gas path of the ceramic matrix composite gas turbine component to produce a modified surface with a surface roughness of less than 3 micrometers, and positioning a seal in the seal slot. The modified surface being substantially devoid of fibers. The modifying is selected from the group of techniques consisting of applying unreinforced matrix plies to the surface, vapor depositing silicon on the surface, honing the surface, applying braze paste to the surface, and combinations thereof.

In another embodiment, a ceramic matrix composite gas turbine component includes a modified surface including a surface roughness of less than 6 micrometers. The modified surface being selected from the group consisting of unreinforced matrix plies applied to a surface of the ceramic matrix composite gas turbine component, silicon vapor deposited on the surface, a honed surface, a braze paste applied to the surface, and combinations thereof.

In another embodiment, a process of honing a ceramic matrix composite surface includes providing a non-abrasive material, positioning the non-abrasive material adjacent to the ceramic matrix composite surface, and depositing at least a portion of the non-abrasive material on the ceramic matrix composite surface by conducting at least about 300 honing cycles. Each honing cycle comprises moving at least one of the non-abrasive material or the ceramic matrix composite surface relative to the other.

Other features and advantages of the present invention will be apparent from the following more detailed description, taken in conjunction with the accompanying drawings which illustrate, by way of example, the principles of the invention.

BRIEF DESCRIPTION OF THE DRAWINGS

FIG. 1 is a schematic view of a process for producing a gas turbine component according to an embodiment of the disclosure.

FIG. 2 is a schematic view of a matrix ply modified gas turbine component surface according to an embodiment of the disclosure.

FIG. 3 is a schematic view of chemical vapor deposition modified gas turbine component surface according to an embodiment of the disclosure.

FIG. 4 is a schematic view of a honed gas turbine component surface according to an embodiment of the disclosure.

Wherever possible, the same reference numbers will be used throughout the drawings to represent the same parts.

DETAILED DESCRIPTION OF THE INVENTION

Provided is a gas turbine component and a process for producing a gas turbine component. Embodiments of the present disclosure, for example, in comparison to concepts failing to include one or more of the features disclosed herein, increase machinability of a ceramic matrix composite component, increase interval life of a ceramic matrix composite component, provide a method for repairing ceramic matrix composite components without increasing a number of exposed fibers, decrease ceramic matrix composite fiber exposure to a hot gas path environment, decrease oxidation of ceramic matrix composite fibers, provide decreased surface roughness, decrease leakage, decrease seal wear, decrease fiber coating distress, or a combination thereof.

Referring to FIG. 1, in one embodiment, a process 100 includes a manufacturing process for producing a ceramic matrix composite (CMC) component, such as a CMC gas turbine component 110. In a further embodiment, the process 100 includes modifying a surface 111 of the CMC gas turbine component 110 to produce a modified surface 113 having a reduced surface roughness. In one embodiment, the process 100 includes a repair process for producing the modified surface 113 and increasing an interval life of the CMC component. Modifying the surface 111 of the CMC gas turbine component 110 includes any suitable technique, such as, but not limited to, applying unreinforced matrix plies 201 (FIG. 2) to the surface 111, depositing a material 301 (FIG. 3) on the surface 111, honing (FIG. 4) the surface 111, applying braze past to the surface 111, or a combination thereof. According to the process 100, the term "honing" encompasses honing, burnishing, and/or polishing of the surface 111. Suitable values for the reduced surface roughness include, but are not limited to, a surface roughness of less than 6 micrometers, less than 3 micrometers, between about 3 and about 6 micrometers, less than 2 micrometers, between about 1 micrometer and about 3 micrometers, between about 1 micrometer and about 2 micrometers, or any combination, sub-combination, range, or sub-range thereof.

The surface 111 includes any surface that may have exposed CMC fibers, such as, but not limited to, a hot gas path component surface, a turbine shroud surface, a sealing surface, a seal slot surface, a slash face seal slot surface, a damper cavity surface for a damper pin in the CMC gas turbine component 110, a surface on a dovetail attachment face of the CMC gas turbine 110, a surface of any other component or feature that may have exposed CMC fibers, or a combination thereof. For example, in one embodiment, the surface 111 includes the seal slot surface along the hot gas path of the CMC gas turbine component 110. In another embodiment, the surface 111 includes a seal positioned in the seal slot. In yet another embodiment, the surface 111 includes the dovetail attachment face of a CMC gas turbine rotating or non-rotating airfoil.

Suitable materials for the surface 111 include, but are not limited to, a CMC material, a nickel-based alloy, or a combination thereof. In one example, the nickel-based alloy has a composition, by weight, of about 0.015% boron, about 0.05% to about 0.15% carbon, about 20% to about 24% chromium, about 3% iron, about 0.02% to about 0.12% lanthium, about 1.25% manganese, about 20% to about 24% nickel, about 0.2% to about 0.5% silicon, about 13% to about 15% tungsten, and balance cobalt. In another example, the nickel-based alloy has a composition, by weight, of between about 19% and about 21% chromium, about 15% tungsten, between about 9% and about 11% nickel, about 3% iron, between about 1% and about 2% manganese, about 0.40% silicon, about 0.030% sulfur, and balance cobalt.

The modified surface 113 includes any suitable surface having the reduced surface roughness. In one embodiment, a composition of the modified surface 113 is similar or substantially similar to the surface 111. In another embodiment, the modified surface 113 includes the surface 111 having the material 301 deposited thereon. One suitable material for deposition on the surface 111 includes silicon. Other suitable materials for deposition on the surface 111 include, but are not limited to, a material having a composition, by weight, of about 0.015% boron, about 0.05% to about 0.15% carbon, about 20% to about 24% chromium, about 3% iron, about 0.02% to about 0.12% lanthium, about 1.25% manganese, about 20% to about 24% nickel, about 0.2% to about 0.5% silicon, about 13% to about 15% tungsten, and balance cobalt; a material having a composition, by weight, of between about 50% and about 55% nickel, between about 17% and about 21% chromium, between about 2.80% and about 3.30% molybdenum, about 0.35% manganese, about 0.35% silicon, about 0.08% carbon, and balance iron; or a combination thereof. In a further embodiment, the material 301 is deposited into crevasses of fiber plies in the surface 111 to produce the modified surface 113 and reduce a coefficient of friction, the surface roughness, a wear of the seal, or a combination thereof.

Referring to FIG. 2, in one embodiment, the applying of the unreinforced matrix plies 201 includes laying-up any suitable number of matrix-only plies at the sealing surface of the CMC gas turbine component 110. Suitable numbers of matrix-only plies include, for example, at least 3 plies, at least 4 plies, at least 5 plies, between 3 and 5 plies, or any combination, sub-combination, range, or sub-range thereof. As used herein, the term "matrix-only" refers to being unreinforced, for example, by being devoid or substantially devoid of fibers. In another embodiment, the unreinforced matrix plies 201 applied to the CMC gas turbine component 110 are integrated with the sealing surface. For example, in a further embodiment, interlacing the unreinforced matrix plies 201 into the CMC gas turbine component 110 forms an integral portion of the CMC gas turbine component 110.

Referring to FIG. 3, in one embodiment, the depositing of the material 301 on the surface 111 includes vapor deposition of the material 301, for example, chemical vapor deposition (CVD) or physical vapor deposition (PVD). In a further embodiment, silicon is deposited onto the surface 111 in a seal slot cavity using atmospheric CVD, low-pressure CVD, ultrahigh vacuum CVD, plasma-assisted or plasma-enhanced CVD, hybrid physical-chemical CVD, diffusion, or a combination thereof.

Referring to FIG. 4, in one embodiment, the honing of the surface 111 includes machining the surface 111 with an abrasive material and/or a non-abrasive material to form a honed surface 401. Examples of the abrasive material include, but are not limited to, an abrasive stone including grains of corundum, silicon carbide, cubic boron nitride, diamond, and combinations thereof. In one embodiment, the honing of the surface 111 with the abrasive material includes using a vibratory diamond plate to decrease the roughness of the surface 111 in the seal slot and form the honed surface 401. Examples of the non-abrasive material include, but are not limited to, the nickel-based alloy having the composition, by weight, of about 0.015% boron, about 0.05% to about 0.15% carbon, about 20% to about 24% chromium, about 3% iron, about 0.02% to about 0.12% lanthium, about 1.25% manganese, about 20% to about 24% nickel, about 0.2% to about 0.5% silicon, about 13% to about 15% tungsten, and balance cobalt; the nickel-based alloy having the composition, by weight, of between about 19% and about 21% chromium, about 15% tungsten, between about 9% and about 11% nickel, about 3% iron, between about 1% and about 2% manganese, about 0.40% silicon, about 0.030% sulfur, and balance cobalt; other nickel-based superalloys, and combinations thereof. The honing of the surface 111 with the non-abrasive material deposits material into crevasses of the unreinforced matrix plies 201 and/or fiber-reinforced plies to decrease the roughness and/or increase compliance of the surface 111. In another embodiment, depositing of the non-abrasive material onto the surface 111, such as, for example, the dovetail attachment face of the rotating or non-rotating airfoil, decreases the coefficient of friction of the surface 111.

In one embodiment, the honing of the surface 111 includes a honing temperature of at least about 400° F., between about 400° and about 1300° F., between about 450° and about 1200° F., between about 550° and about 1200° F., between about 550° and about 850° F., between about 850° and about 1200° F., between about 1000° and about 1200° F., or any combination, sub-combination, range, or sub-range thereof. Increasing the honing temperature further decreases the coefficient of friction of the modified surface 113 formed by the honing of the surface 111. In another embodiment, the honing of the surface 111 includes a honing contact pressure of at least about 30,000 psi, between about 30,000 psi and about 100,000 psi, between about 40,000 and about 80,000 psi, between about 60,000 and about 80,000 psi, between about 70,000 and about 80,000 psi, or any combination, sub-combination, range, or sub-range thereof. The honing contact pressure is the normal force on the surface 111 divided by a contact area. In a further embodiment, the honing of the surface 111 includes a honing displacement of between about 0.0001 and about 0.050 inches, between about 0.0001 and about 0.040 inches, between about 0.0005 and about 0.040 inches, between about 0.001 and about 0.040 inches, or any combination, sub-combination, range, or sub-range thereof. The honing displacement is the relative motion between the abrasive material or the non-abrasive material and the surface 111.

A number of honing cycles is selected based upon at least the honing temperature, the honing pressure, and/or the honing displacement. In one example, an increase in the honing temperature and/or the honing contact pressure provides a similar or substantially similar coefficient of friction of the surface 111 with a decreased number of honing cycles. In another example, the number of honing cycles is varied with variations in the honing displacement. A suitable number of honing cycles includes at least about 300 cycles, at least about 500 cycles, between about 100 and about 10,000 cycles, between about 300 and about 10,000 cycles, between about 500 and about 10,000 cycles, or any combination, sub-combination, range, or sub-range thereof.

The modifying of the surface 111 of the CMC gas turbine component 110 reduces or eliminates the exposed CMC fibers. In one embodiment, the modifying provides a separate exposed surface on the surface 111 by the applying of the unreinforced matrix plies 201, the vapor depositing of the silicon 301, the applying of the braze paste, or any other suitable technique for providing the separate exposed surface. In another embodiment, the separate exposed surface is refined by any suitable refining technique, such as, but not limited to, the honing of the surface 111, electrical discharge machining (EDM), or a combination thereof. In an alternate embodiment, the honing of the surface 111 removes exposed portions of the CMC fibers to reduce or eliminate the exposed CMC fibers on the surface 111 without providing the separate exposed surface.

By reducing or eliminating the exposed CMC fibers, the process 100 forms the modified surface 113 being devoid or substantially devoid of CMC fibers and/or the exposed CMC fibers. In one embodiment, the modified surface 113 reduces the surface roughness of the CMC gas turbine component 110, decreases exposure of the CMC fibers to high temperature oxygen environments to decrease fiber coating distress, or a combination thereof. In another embodiment, the reduced surface roughness of the modified surface 113 facilitates machining to achieve high surface finishes. In a further embodiment, the reduced surface roughness and/or the high surface finishes decrease a leakage rate of the component, decrease machining cuts, increase seal wear resistance, or a combination thereof. Additionally, in one embodiment, the modifying of the surface 111 reduces wear couples between a hard CMC interface and a ductile seal, prohibits reactions between free silicon in matrix of the CMC gas turbine component 110 and metal in the seal, or combinations thereof.

While the invention has been described with reference to one or more embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process of producing a ceramic matrix composite gas turbine component, the process comprising:

modifying a surface of the ceramic matrix composite gas turbine component to produce a modified surface with a surface roughness of less than 6 micrometers;
wherein modifying the surface includes machining with a non-abrasive material, machining with the non-abrasive material applying a contact pressure on the surface and depositing at least a portion of the non-abrasive material into crevasses on the surface.

2. The process of claim 1, wherein the surface is selected from the group consisting of a damper cavity surface for a damper pin in the ceramic matrix composite gas turbine component, a dovetail attachment face of a ceramic matrix composite gas turbine rotating airfoil, and the dovetail attachment face of a ceramic matrix composite gas turbine non-rotating airfoil.

3. The process of claim 1, wherein modifying further comprises machining with an abrasive material, and then machining with the non-abrasive material.

4. The process of claim 1, wherein the crevasses are formed by plies selected from the group consisting of unreinforced matrix plies and fiber-reinforced plies.

5. The process of claim 1, wherein the depositing the non-abrasive material into the crevasses on the surface decreases a coefficient of friction of the surface.

6. The process of claim 1, wherein the surface roughness is less than 3 micrometers.

7. The process of claim 1, wherein the surface roughness is between 1 micrometer and 2 micrometers.

8. The process of claim 1, wherein the process is a manufacturing process.

9. The process of claim 1, wherein the process is a repair process.

10. The process of claim 1, wherein the modified surface is substantially devoid of fibers.

11. The process of claim 1, wherein the modified surface includes a deposited material having a composition, by weight, of about 0.015% boron, about 0.05% to about 0.15% carbon, about 20% to about 24% chromium, about 3% iron, about 0.02% to about 0.12% lanthanum, about 1.25% manganese, about 20% to about 24% nickel, about 0.2% to about 0.5% silicon, about 13% to about 15% tungsten, and balance cobalt.

12. The process of claim 1, wherein modifying further includes applying at least one unreinforced matrix ply, and then machining with the non-abrasive material.

13. The process of claim 1, wherein the surface is positioned in a seal slot along a hot gas path of the ceramic matrix composite gas turbine component.

14. The process of claim 13, wherein the modifying of the surface decreases leakage in the seal slot.

15. The process of claim 13, further comprising positioning a seal in the seal slot.

16. The process of claim 15, wherein the modified surface prohibits reactions between free silicon in matrix of the ceramic matrix composite gas turbine component and metal in the seal.

17. The process of claim 15, wherein the seal includes ceramic matrix composite material.

18. The process of claim 15, wherein the seal includes a nickel-based alloy.

19. The process of claim 18, wherein the nickel-based alloy has a composition, by weight, of about 0.015% boron, about 0.05% to about 0.15% carbon, about 20% to about 24% chromium, about 3% iron, about 0.02% to about 0.12% lanthanum, about 1.25% manganese, about 20% to about 24% nickel, about 0.2% to about 0.5% silicon, about 13% to about 15% tungsten, and balance cobalt.

20. The process of claim 18, wherein the nickel-based alloy has a composition, by weight, of between about 19% and about 21% chromium, about 15% tungsten, between about 9% and about 11% nickel, about 3% iron, between about 1% and about 2% manganese, about 0.40% silicon, about 0.030% sulfur, and balance cobalt.

21. A process of producing a ceramic matrix composite gas turbine component, the process comprising:
modifying a surface positioned in a seal slot along a hot gas path of the ceramic matrix composite gas turbine component to produce a modified surface with a surface roughness of less than 3 micrometers; and
positioning a seal in the seal slot;
wherein the modified surface is substantially devoid of fibers; and
wherein modifying includes vapor depositing silicon, and then machining with a non-abrasive material, machining with the non-abrasive material applying a contact pressure on the surface and depositing at least a portion of the non-abrasive material into crevasses on the surface.

22. A process of machining a ceramic matrix composite surface of a gas turbine component, the process comprising:
providing a non-abrasive material;
positioning the non-abrasive material adjacent to the ceramic matrix composite surface of the gas turbine component; and
applying a contact pressure on the surface and depositing at least a portion of the non-abrasive material into crevasses on the ceramic matrix composite surface by conducting at least about 300 machining cycles;
wherein each of the machining cycles comprises moving at least one of the non-abrasive material or the ceramic matrix composite surface relative to the other.

23. The process of claim 22, further comprising conducting between about 500 and about 10,000 machining cycles.

24. The process of claim 22, wherein the depositing of the non-abrasive material decreases a coefficient of friction of the ceramic matrix composite surface.

25. The process of claim 22, wherein the depositing of the non-abrasive material decreases a roughness of the ceramic matrix composite surface.

26. The process of claim 22, wherein the depositing of the non-abrasive material increases a compliance of the ceramic matrix composite surface.

27. The process of claim 22, wherein each of the machining cycles includes a honing displacement of between about 0.0005 inches and 0.040 inches.

28. The process of claim 22, wherein the non-abrasive material comprises a nickel-based alloy.

29. The process of claim 22, further comprising providing a machining temperature of between about 450° F. and 1200° F.

30. The process of claim 29, wherein increasing the machining temperature decreases a coefficient of friction of the ceramic matrix composite surface with a decreased number of the machining cycles.

31. The process of claim 22, further comprising providing a machining contact pressure of between about 40,000 psi and about 80,000 psi.

32. The process of claim 31, wherein increasing the machining contact pressure decreases a coefficient of friction of the ceramic matrix composite surface with a decreased number of the machining cycles.

33. A process of producing a ceramic matrix composite gas turbine component, the process comprising:
modifying a surface of the ceramic matrix composite gas turbine component to produce a modified surface with a surface roughness of less than 6 micrometers, wherein the surface is selected from the group consisting of a damper cavity surface for a damper pin in the ceramic matrix composite gas turbine component, a dovetail attachment face of a ceramic matrix composite gas turbine rotating airfoil, and the dovetail attachment face of a ceramic matrix composite gas turbine non-rotating airfoil;
wherein modifying includes machining with a non-abrasive material, machining with the non-abrasive material applying a contact pressure on the surface and depositing at least a portion of the non-abrasive material into crevasses on the surface, the crevasses being formed by plies selected from the group consisting of the unreinforced matrix plies and fiber-reinforced plies.

34. The process of claim 33, wherein depositing the non-abrasive material into the crevasses on the surface decreases a coefficient of friction of the surface.

35. The process of claim 33, wherein the surface roughness is less than 3 micrometers.

36. The process of claim 33, wherein the surface roughness is between 1 micrometer and 2 micrometers.

37. The process of claim 33, wherein the process is a manufacturing process.

38. The process of claim 33, wherein the process is a repair process.

39. The process of claim 33, wherein the modified surface is substantially devoid of fibers.

40. The process of claim 33, wherein modifying further includes vapor depositing silicon, and then machining with the non-abrasive material.

41. The process of claim 33, wherein modifying further includes applying braze paste, and then machining with the non-abrasive material.

42. The process of claim 33, wherein modifying further includes applying at least one unreinforced matrix ply, and then machining with the non-abrasive material.

* * * * *